US010622218B2

(12) United States Patent
Engelhardt et al.

(10) Patent No.: US 10,622,218 B2
(45) Date of Patent: Apr. 14, 2020

(54) SEGMENTED EDGE PROTECTION SHIELD

(71) Applicant: Infineon Technologies AG, Neubiberg (DE)

(72) Inventors: Manfred Engelhardt, Villach-Landskron (AT); Michael Roesner, Villach (AT); Georg Ehrentraut, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/707,176

(22) Filed: Sep. 18, 2017

(65) Prior Publication Data

US 2018/0005838 A1 Jan. 4, 2018

Related U.S. Application Data

(62) Division of application No. 14/717,780, filed on May 20, 2015, now Pat. No. 9,793,129.

(51) Int. Cl.
H01L 21/3065 (2006.01)
H01L 21/78 (2006.01)
H01J 37/32 (2006.01)
H01L 21/67 (2006.01)

(52) U.S. Cl.
CPC .... H01L 21/3065 (2013.01); H01J 37/32642 (2013.01); H01J 37/32651 (2013.01); H01L 21/67092 (2013.01); H01L 21/78 (2013.01)

(58) Field of Classification Search
CPC combination set(s) only.
See application file for complete search history.

(56) References Cited

U.S. PATENT DOCUMENTS

| 3,927,225 | A | 12/1975 | Cordes |
| 6,176,967 | B1 * | 1/2001 | Obszarny ............... C23F 4/00 156/345.3 |
| 6,696,663 | B2 | 2/2004 | Tachino |
| 8,912,075 | B1 * | 12/2014 | Lei ..................... H01L 21/6836 257/620 |
| 9,048,309 | B2 | 6/2015 | Chowdhury et al. |
| 9,196,498 | B1 | 11/2015 | Nangoy |
| 2004/0018127 | A1 | 1/2004 | Long |
| 2006/0024923 | A1 | 2/2006 | Sarma |
| 2010/0144154 | A1 | 6/2010 | Komuro |
| 2012/0322234 | A1 | 12/2012 | Yalamanchili et al. |
| 2013/0316472 | A1 | 11/2013 | Joshi |

(Continued)

FOREIGN PATENT DOCUMENTS

| CN | 104395988 | 3/2015 |
| EP | 1186684 | 3/2002 |
| JP | 2007201179 | 8/2007 |

*Primary Examiner* — Long Pham
(74) *Attorney, Agent, or Firm* — Dicke, Billig & Czaja, PLLC

(57) ABSTRACT

A segmented edge protection shield for plasma dicing a wafer. The segmented edge protection shield includes an outer structure and a plurality of plasma shield edge segments. The outer structure defines an interior annular edge configured to correspond to the circumferential edge of the wafer. Each one of the plurality of plasma shield edge segments is defined by an inner edge and side edges. The inner edge is interior to and concentric to the annular edge of the outer structure. The side edges extend between the inner edge and the annular edge.

16 Claims, 7 Drawing Sheets

(56) References Cited

U.S. PATENT DOCUMENTS

2015/0099350 A1 4/2015 Srinivasan
2016/0086852 A1\* 3/2016 Holden ................... H01L 21/78
　　　　　　　　　　　　　　　　　　　438/462

\* cited by examiner

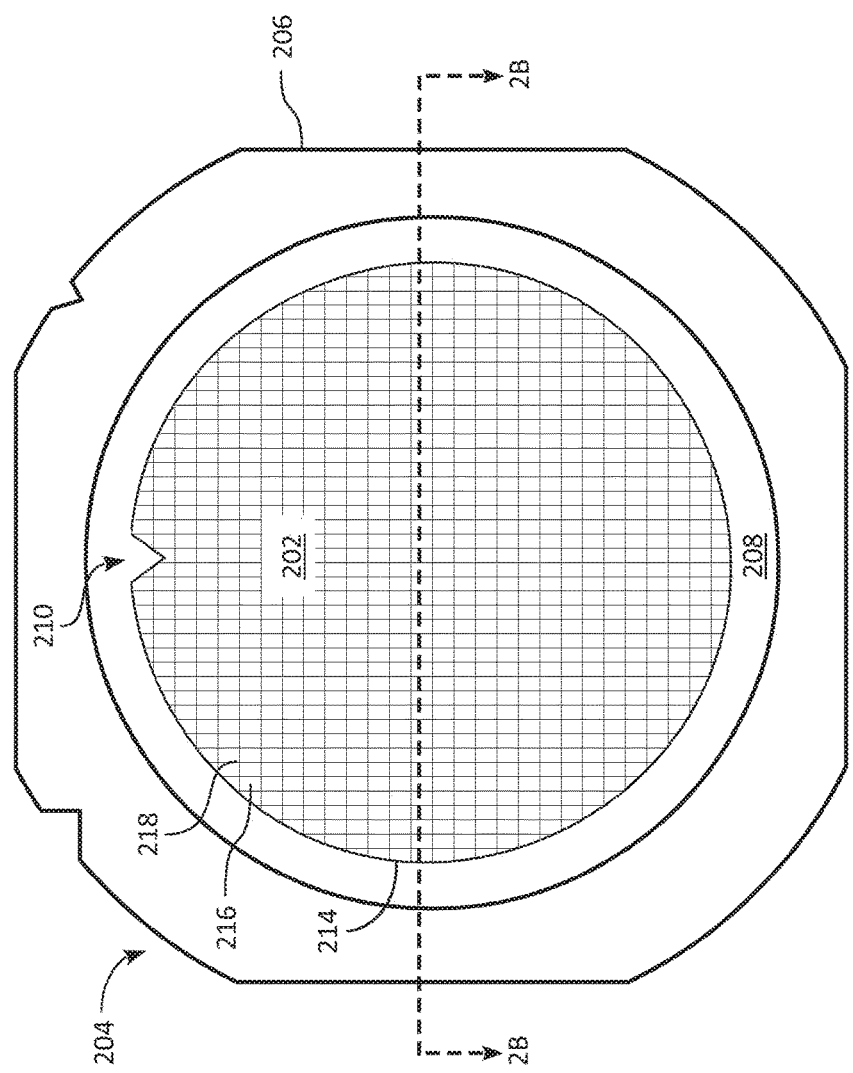
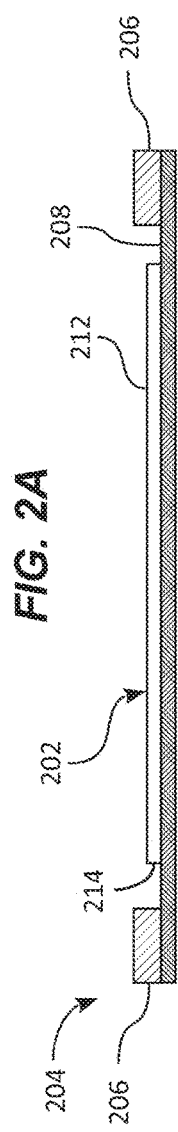
FIG. 2A
FIG. 2B

SEGMENTED EDGE PROTECTION SHIELD

CROSS-REFERENCE TO RELATED APPLICATIONS

This Utility Patent Application is a divisional application of U.S. application Ser. No. 14/717,780, filed May 20, 2015, which is herein incorporated by reference.

TECHNICAL FIELD

The present application relates to a segmented edge protection shield, in particular, a segmented edge protection shield for plasma dicing a wafer.

BACKGROUND

During semiconductor wafer processing, integrated circuits or die are formed on thin wafer substrates that are made of silicon or other materials. After wafer processing is complete, the die must be singulated or separated into individual die before they are packaged. This singulation process is referred to as wafer dicing. One technique that is used for wafer dicing is mechanical sawing. With this approach, a high speed rotating saw is used to separate adjacent die along kerf lines, which are also known as dicing channels or streets. Another technique that is used for wafer dicing is a laser-based approach that is referred to as stealth dicing. Both of these approaches are sequential techniques which can become time consuming when there are a large number of die that need to be singulated on a wafer. Mechanical dicing has a further disadvantage in that chipping and/or crack formation can occur which can decrease die strength resulting in reduced die reliability and wafer yields.

Plasma dicing is another technique that is used for wafer dicing. Plasma dicing is a dry etching process that does not require physical contact with a wafer thus tending to avoid issues inherent with mechanical dicing such as die chipping and cracking. With plasma dicing, the time to complete the dicing operation does not increase with smaller die and the larger number of kerf lines that need to be etched because plasma dicing provides a simultaneous separation of all die on a wafer with a single plasma etch process step. Plasma dicing is based on a multiplexed deep reactive ion etching (DRIE) technique and can be performed on wafers mounted in standard tape frames or carriers. To prepare wafers for plasma dicing, a lithographic process is used to expose kerf lines on the wafer. The exposed kerf lines typically extend to the edge of the wafer and therefore can include adjacent partial die near the edge. This lithographic process enables direct access by plasma during the etching step to etch through the wafer along the kerf lines. With plasma dicing after grinding (PDAG), also referred to as dicing post grinding (DPG), the wafer is thinned and mounted onto an adhesive underlayer or glue within a wafer carrier before undergoing the plasma singulation process.

If relatively large die are to be plasma diced on a wafer, the lithographic process performed prior to dicing will expose kerf lines that extend up to the edge of the wafer. Due to their size and corresponding large contact area with the adhesive underlayer in the wafer carrier, these die, including the partial die located near the edge of the wafer, remain temporarily well-bonded to the adhesive underlayer after plasma singulation and during subsequent processing steps (e.g., lamination, demounting, etc. . . . ), before pick and place tape release techniques are used to remove the die from the adhesive underlayer for packaging.

Smaller die will have a smaller contact area with the adhesive underlayer. Because the lithographic process performed prior to plasma dicing will expose kerf lines that extend up to the edge of the wafer, these die, and especially the partial die located near the edge of the wafer, are significantly more prone to chipping and cracking and subsequent delamination from the adhesive underlayer after plasma singulation is complete.

One technique that has been used to prevent this delamination is to use a protection ring inside the plasma reactor chamber of the plasma etch processing tool during plasma dicing. The protection ring is placed between the plasma source and the surface of the wafer and prevents the plasma from etching the outer peripheral edge of the wafer that includes the partial die. Use of the protection ring however leaves an unetched ring of material around the edge of the wafer that requires an additional process step for removal before pick and place techniques can be used for packaging the die.

SUMMARY

According to an embodiment of a segmented edge protection shield for plasma dicing a wafer, the segmented edge protection shield includes an outer structure and a plurality of plasma shield edge segments. The outer structure defines an interior annular edge configured to correspond to the circumferential edge of the wafer. Each one of the plurality of plasma shield edge segments is defined by an inner edge and side edges. The inner edge is interior to and concentric to the annular edge of the outer structure. The side edges extend between the inner edge and the annular edge.

According to an embodiment of a method of plasma dicing a wafer, the method includes providing a wafer that has been patterned to expose kerf lines on a surface of the wafer, providing a segmented edge protection shield above the surface of the wafer, and plasma etching the surface of the wafer through the segmented edge protection shield to singulate die within the kerf lines and to singulate a plurality of wafer edge areas. The plurality of wafer edge areas are spaced apart around a circumferential edge of the wafer.

According to an embodiment of a wafer, the wafer includes a plurality of singulated die and a plurality of singulated wafer edge areas. The singulated wafer edge areas are spaced apart around a circumferential edge of the wafer.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A-2B illustrate a top plan view and a cross-sectional view, respectively, of an embodiment of a wafer mounted in a wafer carrier prior to plasma dicing.

DETAILED DESCRIPTION OF ILLUSTRATIVE EMBODIMENTS

Figure 1:
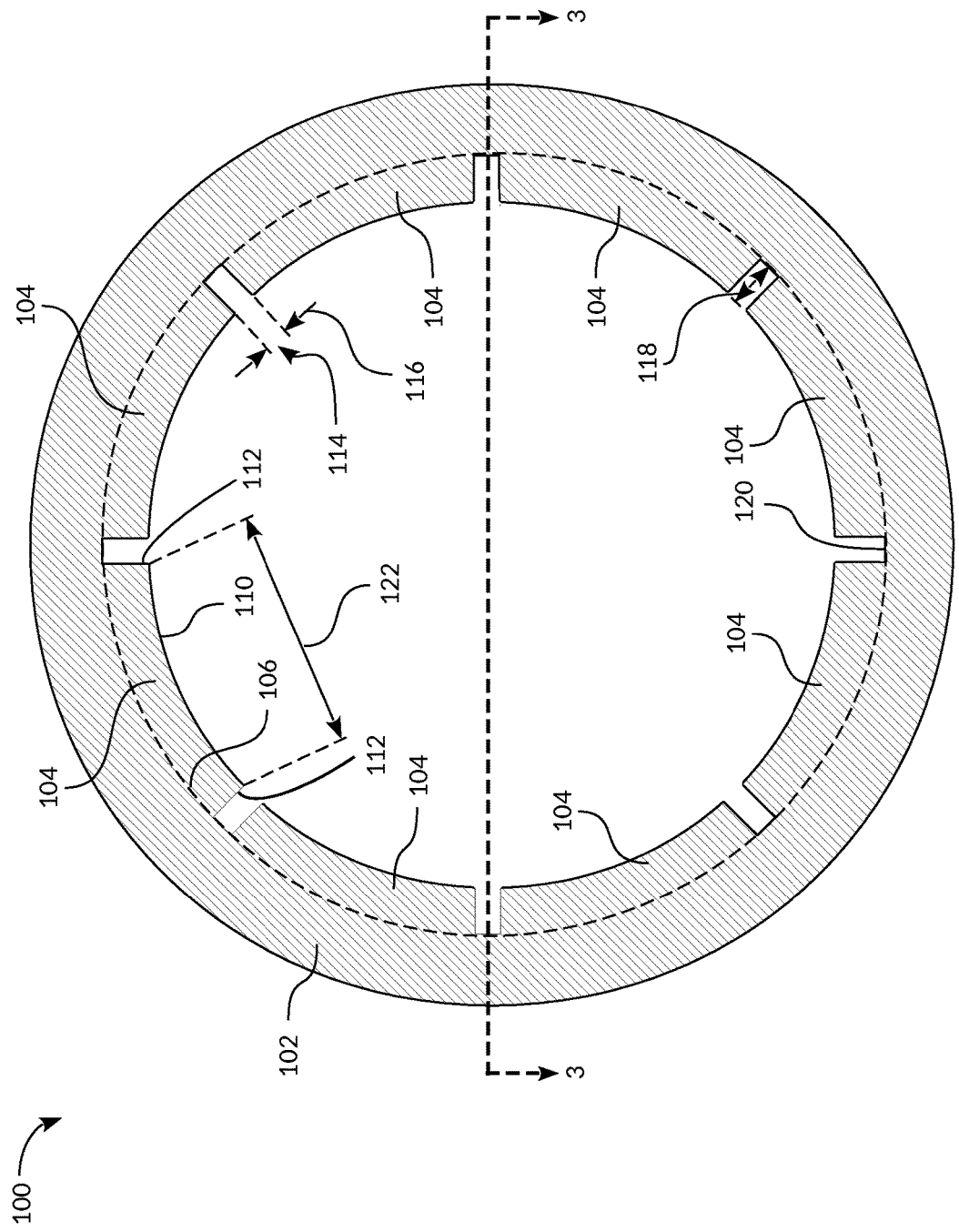
FIG. 1 illustrates a top plan view of an embodiment of a segmented edge protection shield.

FIG. 1 illustrates a top plan view of an embodiment of a segmented edge protection shield 100. The segmented edge protection shield 100 is used for plasma dicing a wafer and includes an outer structure 102 and a plurality of plasma shield edge segments 104. In various embodiments, segmented edge protection shield 100 is made from suitable materials such as aluminum, aluminum nitride or ceramic materials. The material selection can be based on the particular plasma process used to dice the wafer. Example processes include Chlorine-based processes and Fluorine-based processes.

In the illustrated embodiment, outer structure 102 includes an interior annular edge that is indicated by a dashed line at 106. The interior annular edge 106 has a circumference that corresponds to a circumferential edge of a wafer that is to be plasma diced. Examples include, but are not limited to, 200 mm wafers and 300 mm wafers. In the illustrated embodiment, segmented edge protection shield 100 includes eight plasma shield segments 104 that are spaced apart by slots 114 around annular edge 106. In other embodiments, other suitable numbers of plasma shield edge segments 104 can be used. In the illustrated embodiment, each plasma shield edge segment 104 is defined by an inner edge 110 that is interior to and concentric to annular edge 106. Inner edge 110 has a length that is indicated at 122. In the embodiment illustrated in FIG. 1, outer structure 102 and plasma shield edge segments 104 are joined at annular edge 106. Each plasma shield edge segment 104 includes side edges 112 that extend between inner edge 110 and annular edge 106. In the illustrated embodiment, side edges 112 of adjacent plasma shield edge segments 104 are approximately parallel. A distance between adjacent side edges 112 is indicated at 116. In the illustrated embodiment, distance 116 is within a range of 1 mm to 10 mm. In other embodiments, distance 116 can have other suitable values. A distance between inner edge 110 and annular edge 106 is indicated at 118. In the illustrated embodiment, distance 118 is within a range of 1 mm to 10 mm. In other embodiments, distance 118 can have other suitable values.

In the illustrated embodiment, segmented edge protection shield 100 is adapted for use within a plasma reactor chamber of a plasma etch processing tool. Outer structure 102 includes one or more plasma shield elements configured to shield plasma exterior to annular edge 106 where the side edges 112 of adjacent plasma shield edge segments 104 intersect annular edge 106. This is illustrated as an interior shield edge 120. FIG. 1 illustrates outer structure 102 as a single shield ring that provides the plasma shielding at edges 120.

Figure 6:
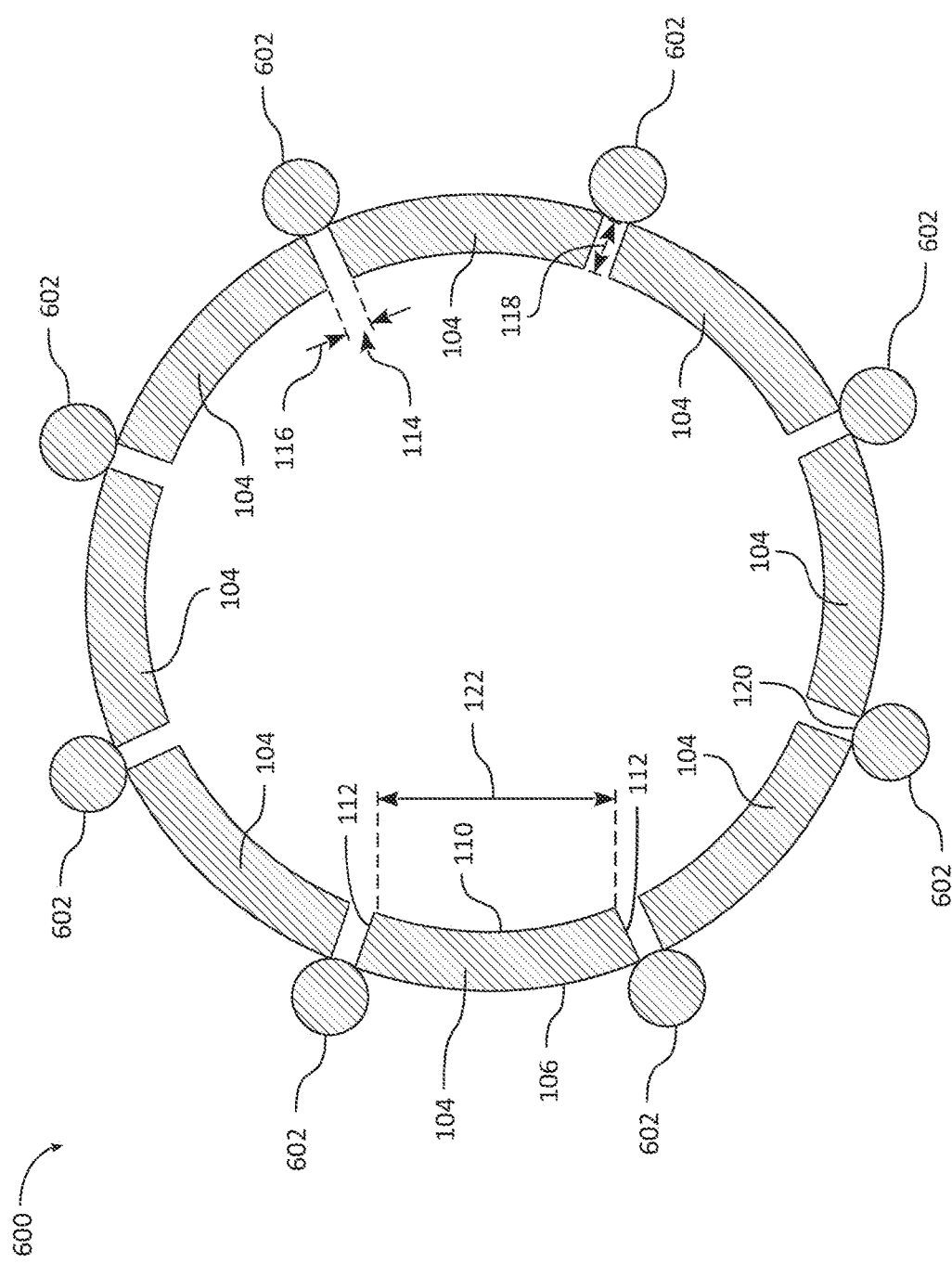
FIG. 6 illustrates a top plan view of an embodiment of a segmented edge protection shield.

FIG. 6 illustrates another embodiment of a segmented edge protection shield at 600 where outer structure 102 comprises eight individual plasma shield elements illustrated at 602 that provide the plasma shielding at edges 120. Each one of the plasma shield elements 602 includes an interior shield edge indicated at 120 that is proximate annular edge 106. Edge 120 is between side edges 112 of adjacent plasma shield edge segments 104 where the side edges 112 intersect annular edge 106. In other embodiments, outer structure 102 or outer structure 602 can have other suitable shapes or dimensions to shield plasma at edges 120.

FIGS. 2A-2B illustrate a top plan view and a cross-sectional view, respectively, of an embodiment of a wafer 202 mounted in a wafer carrier 204 prior to plasma dicing. Wafer carrier 204 includes a frame 206 and an adhesive tape or underlayer 208. Wafer 202 includes an alignment notch 210. Wafer 202 includes a top surface 212 and a circumferential edge 214. In the illustrated embodiment, wafer 202 is thinned by a grinding process prior to mounting on adhesive underlayer 208. For plasma dicing, wafer carrier 204 with wafer 202 is placed under segmented edge protection shield 100 within the plasma reactor chamber of a plasma etch tool (see also, FIG. 3). To prepare wafer 202 for plasma dicing, a lithographic process is used to expose kerf lines 216-218 on the wafer. Vertical kerf lines 216 and horizontal kerf lines 218 surround each die that is to be singulated (see also, FIG. 5B). The exposed kerf lines 216-218 extend to edge 214 of wafer 202.

Figure 3:
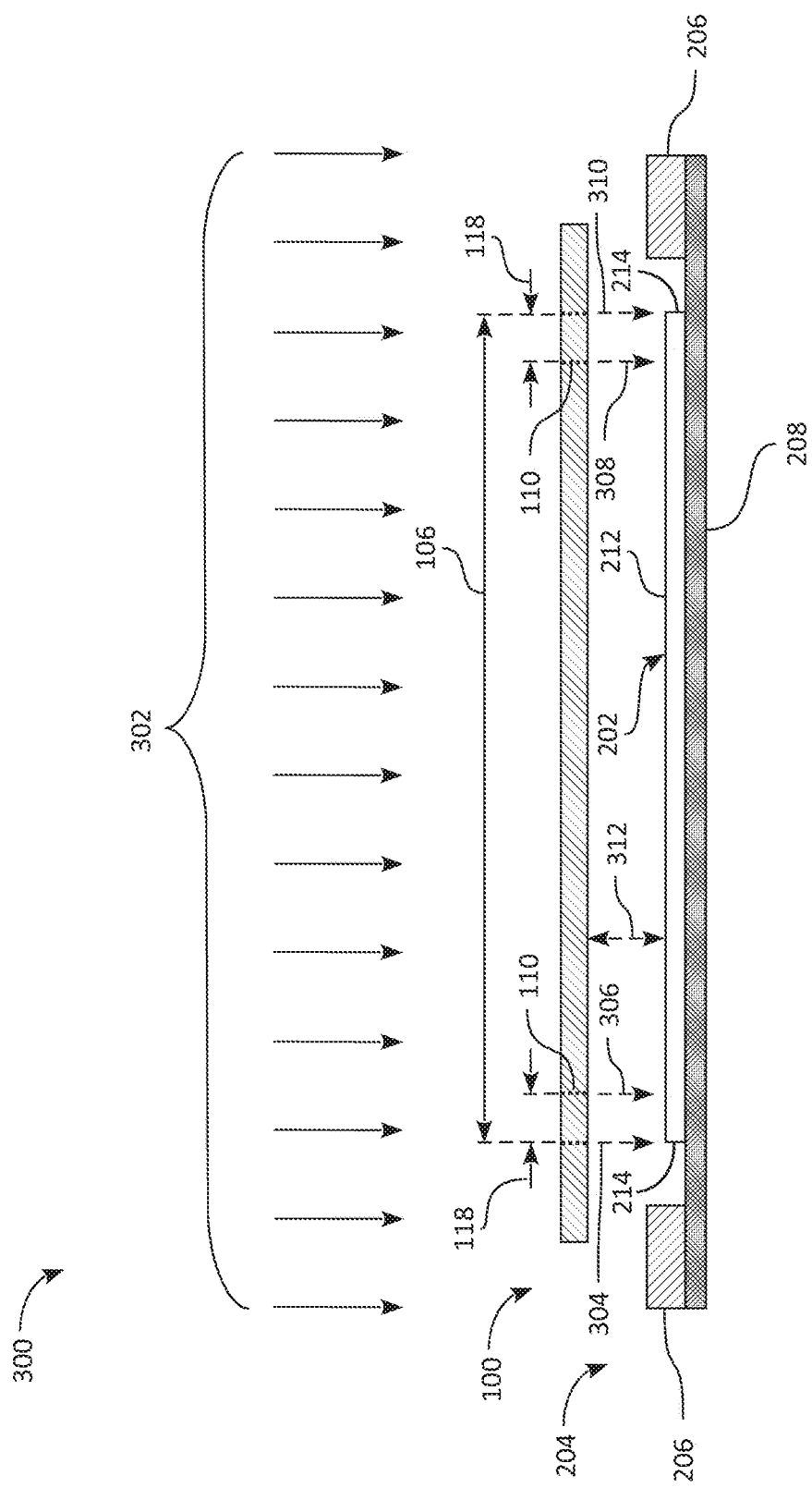
FIG. 3 illustrates a side view of an embodiment of a segmented edge protection shield inside a plasma reaction chamber.

FIG. 3 illustrates a side view of an embodiment of a segmented edge protection shield 100 inside a plasma reaction chamber as illustrated at 300. The cross-sectional view used for segmented edge protection shield 100 is illustrated in FIG. 1 as a dashed line that references FIG. 3. Wafer carrier 204 is transferred into the plasma reaction chamber after wafer 202 has been patterned to expose kerf lines 216-218 and mounted to adhesive underlayer 208. Segmented edge protection shield 100 is placed over surface 212 of wafer 202 at a suitable distance as indicated at 312. Annular edge 106 of segmented edge protection shield 100 has a circumference illustrated at the ends of reference line 106 that is aligned with circumferential edge 214 of wafer 202 (see reference lines 304 and 310). Inner edges 110 of segmented edge protection shield 100 are aligned with surface 212 of wafer 202 as indicated by reference lines 306 and 308. Once segmented edge protection shield 100 and wafer carrier 204 are in position, surface 212 of wafer 202 can be exposed to a plasma 302 to etch through the exposed kerf lines to complete the plasma dicing process.

Figure 4:
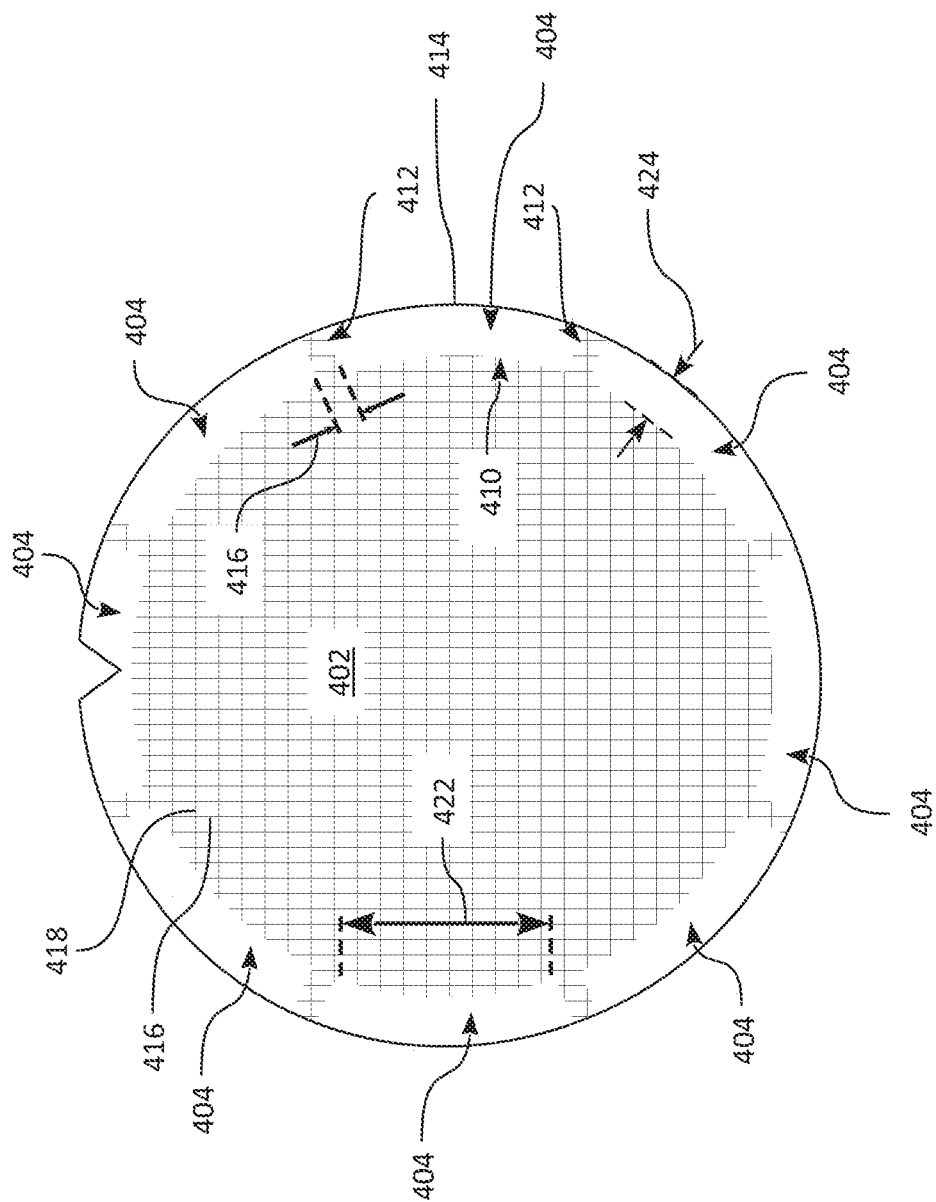
FIG. 4 illustrates a top plan view, respectively, of an embodiment of a wafer after plasma dicing the wafer through the segmented edge protection shield.
Figure 5B:
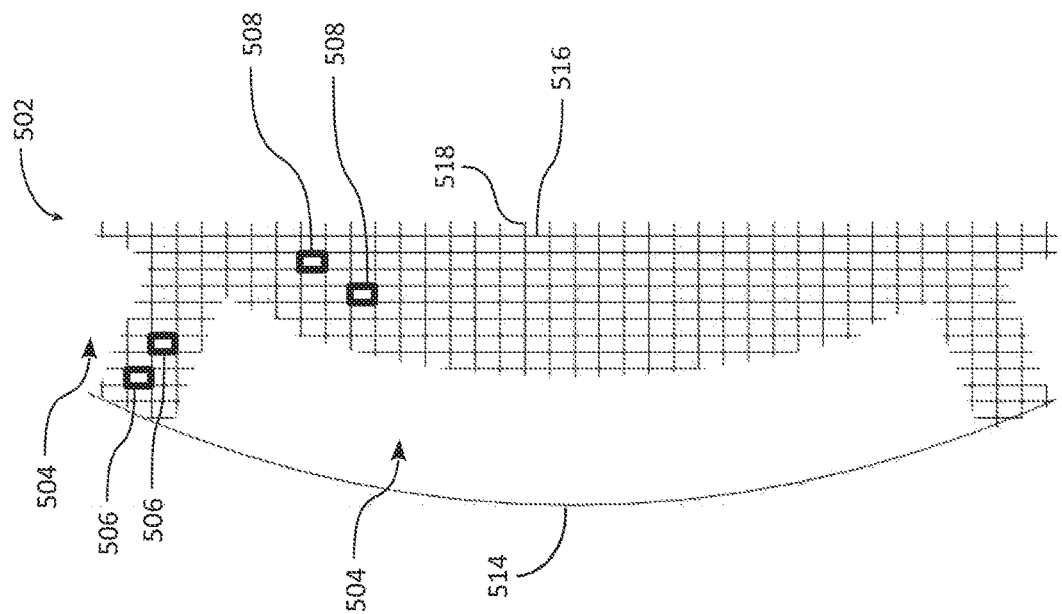
FIGS. 5A-5B illustrate top plan views, respectively, of circumferential edges of wafers to illustrate embodiments of singulated wafer edge areas and singulated die.
Figure 5A:
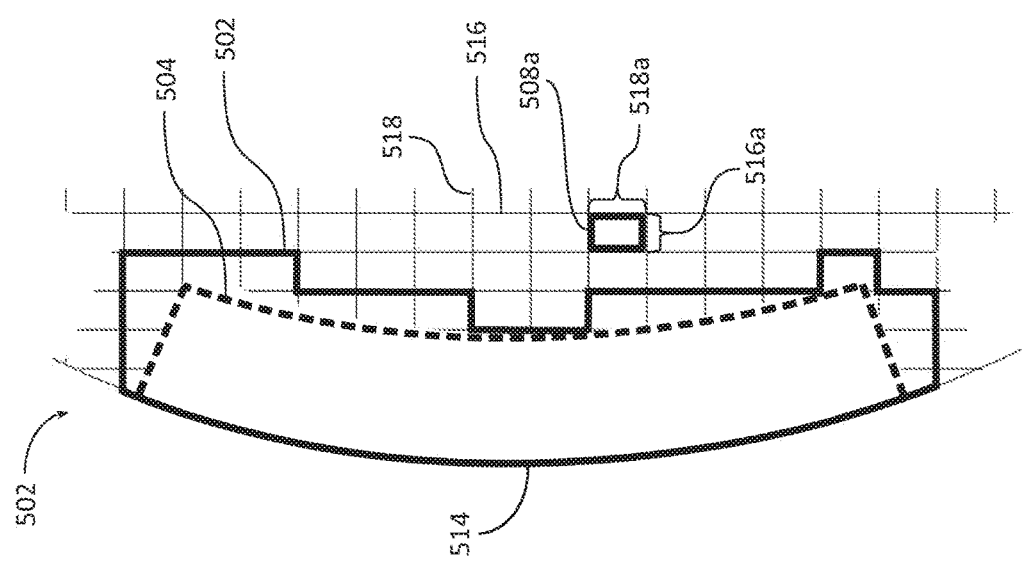

FIG. 4 illustrates a top plan view, respectively, of an embodiment of a wafer 402 that corresponds to wafer 202 after plasma dicing wafer 202 through the segmented edge protection shield 100 as illustrated in FIG. 3. FIGS. 5A-5B illustrate top plan views, respectively, of circumferential edges 514 of wafers 502 that correspond to embodiments of circumferential edge 414 of wafer 402 after plasma dicing and illustrate singulated wafer edge areas 502 and singulated die 506-508. FIG. 4 and FIGS. 5A-5B together illustrate embodiments where wafers 402 and 502 include a plurality of singulated die 506-508 and a plurality of singulated wafer edge areas 502 that are respectively spaced apart around circumferential edges 414 and 514 of wafers 402 and 502. Each singulated wafer edge area 502 includes a corresponding edge segment 504 as illustrated in FIG. 5A. To singulate wafer edge areas 502 and die 506-508, surface 212 of wafer 202 is etched by plasma 302 through the segmented edge protection shield 100. Annular edge 106 of segmented edge protection shield 100 is aligned with circumferential edge 214 of wafer 202 as illustrated in FIG. 3. Segmented edge protection shield 100 provides plasma shielding at inner edge 110 and at side edges 112 for each plasma shield edge segment 104, and further provides plasma shielding at edges 120 that are between adjacent plasma shield edge segments 104. The shielding provided by plasma shield edge segments 104 is illustrated in FIG. 4 by corresponding edge segments 404 and in FIG. 5 by corresponding edge segment 504. Edge segments 404 include an inner edge 410 that is concentric to the circumferential edge 414 of wafer 402. Inner edge 410 has a length that is indicated at 422. Edge segments 404 include side edges 412 that extend between inner edge 410 and circumferential edge 414 of wafer 402. In the illustrated embodiment, the side edges 412 of adjacent edge segments 404 are approximately parallel. A distance between adjacent side edges 412 of adjacent edge segments 404 is indicated at 416. In the illustrated embodiment, distance 416 is within a range of 1 mm to 10 mm. In other embodiments, distance 116 can have other suitable values. A distance or length between the inner edge 410 for edge segments 404 and the circumferential edge 414 of wafer 402 is indicated at 424. In the illustrated embodiment, side edges 412 of all the edge segments 404 have a same length or distance 424. In the illustrated embodiment, distance 424 is within a range of 1 mm to 10 mm. In other embodiments, distance 424 can have other suitable values.

Referring to FIG. 3 and FIGS. 5A-5B, plasma etching surface 212 of wafer 202 through the segmented edge protection shield 100 singulates die 506-508 between vertical kerf lines 516 and horizontal kerf lines 518, and singulates a plurality of wafer edge areas 502 that are spaced apart around circumferential edge 514 of wafer 502. For purposes of illustration, the spacing between vertical kerf lines 516 and the spacing between horizontal kerf lines 518 in FIG. 5A and FIG. 5B are different. This spacing is illustrated at 516a and 518a for the singulated die illustrated at 508a. Singulating the wafer edge areas 502 includes etching interconnected kerf lines 516-518 of partial die that are adjacent to and exterior to edge segments 504. These partial die are illustrated in FIG. 5A between the edge segment 504 border and the wafer edge area 502 border. The kerf lines 516-518 between the edge segment 504 border and the wafer edge area 502 border illustrate interconnected kerf lines for partial die that were singulated during the plasma etch process. Because the die within edge areas 504 (not shown) were not singulated due to shielding from plasma 302 by plasma shield edge segments 104, wafer edge area 502 includes these die. This enables pick and place tape release techniques to remove wafer edge areas 502 and die 506-508 from the adhesive underlayer 208 during the same process step.

In the illustrated embodiments, the spacing between vertical kerf lines (see 516a) can be greater than, the same, or less than the spacing between horizontal kerf lines (see 518a). A maximum distance between adjacent kerf lines is defined as the greater of either spacing 516a or 518a. If spacing 516a is equal to spacing 518a, the maximum distance between adjacent kerf lines is either spacing 516a or spacing 518a. In the embodiments illustrated in FIG. 4 and FIGS. 5A-5B, inner edge 410 of edge segment 404 has a length 422 that is greater than the maximum distance between adjacent kerf lines. Referring to FIG. 5A, spacing 518a (e.g., height of die 508a) is greater than spacing 516a (e.g., width of die 508a) and is the maximum spacing or distance between adjacent kerf lines for wafer 502. In the illustrated embodiments, inner edge 410 of edge segments 404 has a length 422 that is greater than a maximum distance between adjacent kerf lines. In FIG. 5, this maximum distance is illustrated at 518a.

FIG. 5B illustrates an embodiment where singulated die 506 are between the side edges of adjacent edge segments 504. The distance 416 between side edges 412 of adjacent edge segments 404 (as defined in FIG. 4) is greater than the maximum distance between adjacent kerf lines 516 or 518 as illustrated in FIG. 5B so that the die 506 are small enough to fit between the adjacent edge segments 504. Die 518 are located outside of the area between adjacent edge segments 504.

Figure 7:
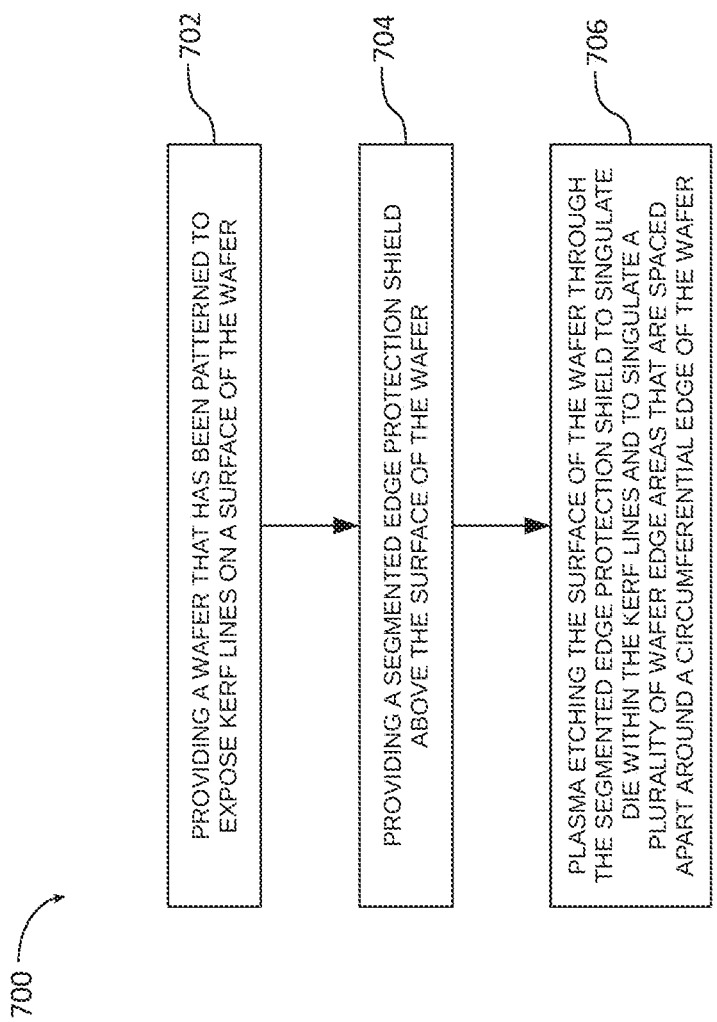
FIG. 7 illustrates a flowchart of an embodiment of a method for plasma dicing a wafer.

FIG. 7 illustrates a flowchart of an embodiment of a method for plasma dicing a wafer. The method is illustrated at 700. At 702, a wafer 202 is provided. Wafer 202 has been patterned to expose kerf lines 216-218 on a surface 212 of wafer 202. At 704, a segmented edge protection shield 100 is provided above the surface 212 of wafer 202. At 706, surface 212 of wafer 202 is plasma etched through segmented edge protection shield 100 to singulate die 506-508 within the kerf lines 516-518 and to singulate a plurality of wafer edge areas 502 that are spaced apart around circumferential edge 514 of wafer 502.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of plasma dicing a wafer, comprising:
providing a wafer that has been patterned to expose kerf lines on a surface of the wafer;
providing a segmented edge protection shield above the surface of the wafer, wherein the segmented edge protection shield includes a plurality of plasma shield edge segments configured to shield corresponding ones of a plurality of edge segments on the surface of the wafer; and
plasma etching the surface of the wafer through the segmented edge protection shield to singulate a plurality of die within the kerf lines and to singulate a plurality of wafer edge areas that are spaced apart around a circumferential edge of the wafer and separated from each other by a gap, wherein each of the plurality of wafer edge areas is larger than each of the plurality of singulated die.

2. The method of claim 1, wherein singulating the plurality of wafer edge areas comprises etching interconnected kerf lines of partial ones of the plurality of die that are adjacent to and exterior to the plurality of edge segments.

3. The method of claim 1, wherein singulating the plurality of wafer edge areas comprises side edges of the plurality of edge segments having a same length.

4. The method of claim 1, wherein singulating the plurality of die within the kerf lines comprises singulating ones of the plurality of die between side edges of adjacent ones of the plurality of edge segments, wherein a distance between the side edges of the adjacent ones of the plurality of edge segments is greater than a maximum distance between adjacent kerf lines.

5. The method of claim 1, wherein a distance between an inner edge of the plurality of edge segments and the circumferential edge of the wafer is about 1 mm to about 10 mm.

6. The method of claim 1, wherein a distance between side edges of adjacent ones of the plurality of edge segments is about 1 mm to about 10 mm.

7. A method of processing a substrate, comprising:
    patterning the substrate to expose kerf lines on a surface of the substrate; and
    singulating a plurality of die within the kerf lines and singulating a plurality of substrate edge areas that are arranged around an edge of the substrate and separated from each other by a gap, wherein each of the plurality of substrate edge areas is larger than each of the plurality of singulated die.

8. The method of claim 7, wherein singulating the plurality of substrate edge areas comprises exposing the surface of the substrate to a plasma through a segmented edge protection shield.

9. The method of claim 7, wherein singulating the plurality of substrate edge areas comprises:
    providing a segmented edge protection shield over the surface of the substrate, wherein the segmented edge protection shield includes a plurality of shield edge segments; and
    exposing the surface of the substrate to a plasma through the segmented edge protection shield.

10. The method of claim 9, wherein exposing the surface of the substrate to the plasma through the segmented edge protection shield comprises the plurality of shield edge segments shielding corresponding ones of a plurality of edge segments on the surface of the substrate from the plasma.

11. The method of claim 10, wherein exposing the surface of the substrate to the plasma through the segmented edge protection shield comprises etching interconnected kerf lines of partial ones of the plurality of die that are adjacent to and exterior to the plurality of edge segments.

12. The method of claim 11, wherein singulating the plurality of substrate edge areas comprises each one of the plurality of substrate edge areas including one of the plurality of edge segments and the partial ones of the plurality of die that are adjacent to and exterior to the one of the plurality of edge segments.

13. The method of claim 10, wherein singulating the plurality of die within the kerf lines comprises singulating ones of the plurality of die between side edges of adjacent ones of the corresponding edge segments.

14. A method of dicing a semiconductor wafer in a plasma reaction chamber, comprising:
    providing a wafer that has been patterned to expose kerf lines on a surface of the wafer;
    exposing the surface of the wafer to a plasma through a segmented edge protection shield spaced above the surface of the wafer, wherein the segmented edge protection shield includes a plurality of shield edge segments configured to shield corresponding ones of a plurality of edge segments on the surface of the wafer from the plasma; and
    singulating a plurality of die on the wafer that are exterior to the plurality of edge segments, wherein each of the plurality of edge segments is larger than each of the plurality of singulated die.

15. The method of claim 14, further comprising singulating a plurality of wafer edge areas that each include one of the plurality of edge segments and singulated partial ones of the plurality of die that are adjacent to the one of the plurality of edge segments.

16. The method of claim 15, wherein singulating the plurality of wafer edge areas comprises an inner edge of the plurality of edge segments having a length that is greater than a maximum distance between adjacent kerf lines.

* * * * *